July 25, 1961 E. H. COOKE-YARBOROUGH 2,994,002

TRANSISTOR BISTABLE CIRCUITS

Filed Sept. 20, 1957

INVENTOR

Edmund H. Cooke-Yarborough

BY

Larson and Taylor

United States Patent Office 2,994,002

Patented July 25, 1961

2,994,002

TRANSISTOR BISTABLE CIRCUITS

Edmund H. Cooke-Yarborough, Longworth, England, assignor to the United Kingdom Atomic Energy Authority of Patents Branch, London, England Filed Sept. 20, 1957, Ser. No. 685,210
Claims priority, application Great Britain Sept. 28, 1956
2 Claims. (Cl. 307—88.5)

This invention relates to transistor bistable circuits.

In our British patent specification No. 762,868 there is described a transistor bistable circuit comprising a single point-type transistor having its emitter earthed, its base connected through a resistor to a positive potential, and its collector connected through a load to a negative potential. The transistor can be switched between conducting and substantially non-conducting stable states by the application of suitable pulses to its base or emitter.

It is an object of the present invention to provide a transistor bistable circuit of similar type suitable for use with junction-type transistors.

According to the present invention a transistor bistable circuit comprises a p-n-p and an n-p-n transistor each having an emitter, a base and a collector, a resistor connected between the collector of each transistor and the base of the other transistor, a diode connected between the collectors, a resistor connected between each base and a bias current source, a connection from one emitter to one side of a potential supply and a connection from the other emitter through a load to the other side of the potential supply.

To enable the nature of the invention to be more readily understood, attention is directed, by way of example, to the accompanying drawings wherein.

Figure 1:
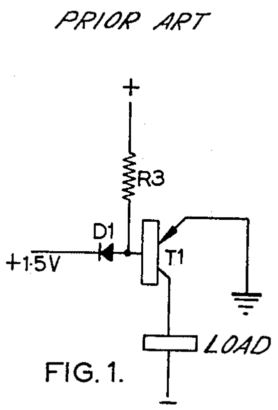
FIG. 1 is a circuit diagram of a point-type transistor bistable circuit.

FIG. 1 shows a point-type transistor bistable circuit of the type described in our British patent specification No. 762,868. A point-type transistor T1 has its emitter earthed and its collector connected to a negative potential through a load. Its base is connected to a positive bias potential through a resistor R3. A catching diode D1 prevents the base potential rising above 1.5 v. The transistor T1 can be switched between a stable conducting state and a stable substantially non-conducting state (i.e. in which the load current is the residual collector current $I_{co}$) by the application of suitable pulses, e.g. to its base, provided the current fed through R3 is greater than $I_{co}$.

Figure 2:
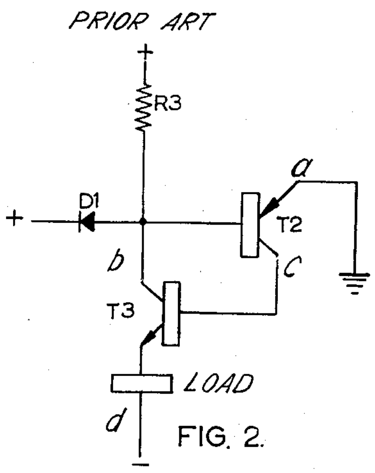
FIG. 2 is a circuit diagram of a bistable circuit using junction-type transistors.

In principle, as shown in FIG. 2, the point-type transistor T1 can be replaced by a complementary pair of junction transistors T2 and T3, which are of the p-n-p and n-p-n type respectively. In this circuit the collector of each is connected to the base of the other, the emitter of T2 is earthed, and the emitter of T3 is connected through the load to a negative potential. In practice however this arrangement is unsatisfactory, owing to the very heavy carrier storage which occurs in both transistors and causes the circuit to take many microseconds to turn off. The reasons for this severe carrier storage can be explained as follows. Suppose that the circuit is in its conducting state and that the current in the load is sufficiently large that the current flowing in the base resistor R3 can be neglected. Then the load current flows from point *a* to point *d*, being shared between the paths *abd* and *acd*. If it is assumed for the sake of simplicity that the two transistors have similar properties, the current will divide approximately equally between these paths and each transistor will pass equal base and collector currents, which means that the collector current is only half the emitter current. Thus only about half the minority carriers injected by the emitter are collected and the rest accumulate in the base region and cause continued conduction by the collector after emitter current has ceased.

If this carrier storage is to be prevented the collector of the p-n-p transistor T2 must be kept slightly negative with respect to its base, and the collector of the n-p-n transistor T3 must be kept slightly positive with respect to its base. This has in the past been done by limiting the voltage swing of both collectors by the use of diodes connected to appropriate voltage points. To prevent excessive currents flowing in the transistors it is necessary to limit the flow of emitter current by use of a resistor and diode combination. As a result the current which can be supplied to the load is limited. The circuit is complex and requires several different voltage supplies for the diodes, and all must have a low impedance.

Figure 3:
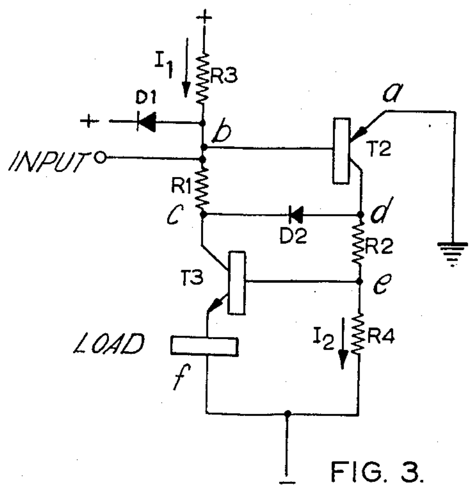
FIG. 3 is a circuit diagram of a bistable transistor circuit according to the present invention.

FIG. 3 shows a circuit according to the present invention, which is intended to overcome these objections. In FIG. 3 the circuit of FIG. 2 has been modified by the addition of a diode D2 connected between the collectors and the insertion of resistors R1 and R2 in the two base-to-collector connections. A resistor R4 has been connected between the base of T3 and the negative potential.

If it is assumed for the sake of simplicity that when the circuit is in the conducting state the currents $I_1$ and $I_2$ flowing in R1 and R2 respectively are equal, then the load current can still be regarded as flowing from point *a* to point *f*. The diode D2 joining the two collectors now provides a third path through which the load current can flow. If the voltage drops in resistors R1 and R2 are both greater than the forward voltage drop in this diode the voltages between collector and base of both transistors are prevented from falling to zero and the accumulation of minority carriers in the base is thus prevented. Under these conditions the collector current of both transistors is $\alpha$ times the emitter current, where $\alpha$ is the current gain between emitter and collector and is just less than unity. If $\alpha$ is assumed to be the same for both transistors then a fraction $\alpha$ of the load current $I_L$ traverses the path *adcf* and a fraction $(1-\alpha)$ follows the path *abcdef*, traversing the collector diode D2 in the opposite direction. A current I (equal to $I_1$ equal to $I_2$) also flows through D2 in the reverse direction. The net current in D2 is therefore $I_L(2\alpha-1)-I$. This causes a forward voltage drop in the diode equal to *v*. The voltage in R1 is $R1(L_1+(1-\alpha)I_L)$. This must be greater than *v*, as must the voltage drop in R2 which is similarly arrived at. It is desirable that this voltage drop should not vary greatly with load current, so $I_1$ and $I_2$ are chosen to be of the same order as the transistor base current at the maximum load current.

The total voltage drop in this bistable circuit when it is in the conducting stage is equal to the emitter-to-base voltage drops of both transistors, plus the voltage drops in resistors R1 and R2, minus the voltage drop *v* in D2. Thus the larger the voltage drop in the diode, the smaller the voltage drop in the bistable circuit. Similarly, if the load current is increased the increased voltage drop across the diode tends to offset that in the rest of the circuit, and the output impedance of the circuit when it is in its conducting state is therefore low.

If the load current is reduced to a value only slightly greater than I, the current in the diode falls to a low value, the diode impedance rises and the net output impedance becomes large and negative, causing the circuit to turn off spontaneously, as in the case of the equivalent point-contact bistable circuit. Alternatively the circuit may be turned off by application of a suitable pulse, for example a positive pulse fed via a diode to the base of the p-n-p transistor T2. When the circuit is in the non-conducting state the emitter current of T2 is cut off and only a small current $I_{co}$ flows between base and collector. The emitter current of the n-p-n transistor T3 is also only slightly greater than $I_{co}$. Thus so long as the current $I_1$ fed to the base of the p-n-p transistor T2 exceeds the sum of both these $I_{co}$ currents the circuit is stable in the non-conducting state. This current can be smaller than the equivalent in the point-contact circuit, and the bistable circuit of FIG. 3 can therefore be simplified by replacing the resistor R3 and the catching diode D1 connected to the base of T2 by a resistor connected to a slightly positive point.

The circuit has the advantage over the point-contact circuit of FIG. 1 that the residual current passing through the load when the circuit is the nominally non-conducting state is considerably smaller. It is also more flexible, as it can be turned on or off by suitable pulses applied to emitter or base of either transistor e.g. to the base of T2 as shown. Moreover the circuit can be inverted, the functions of the two transistors being interchanged and the load being in series with the emitter of the p-n-p transistor.

In practice the two transistors need not have such similar characteristics as are assumed in this description.

By suitable choice of circuit parameters the output impedance in the conducting state can be made zero or negative.

The circuit of FIG. 3 can also be used in the conducting state only, i.e. not as a bistable circuit but simply as a circuit capable of providing a negative output impedance; in this case the diode D2 is replaced by a resistor.

I claim:

1. A transistor bistable circuit comprising a p-n-p and an n-p-n transistor each having an emitter, a base and a collector, said emitter and base being designated control electrodes, a resistor connected between the collector of each transistor and the base of the other transistor, a diode connected between the collectors in a direction to conduct current flowing in the collectors, a resistor connected between each base and a bias current source, a connection from one emitter to one side of a potential supply, a connection from the other emitter through a load to the other side of the potential supply, and an input connection to a control electrode of said transistors.

2. A transistor bistable circuit as claimed in claim 1 wherein the emitter of the p-n-p transistor is connected to the positive side of the potential supply and the emitter of the n-p-n transistor through the load to the negative side of the potential supply.

References Cited in the file of this patent

UNITED STATES PATENTS

| | | |
|---|---|---|
| 2,655,609 | Shockley | Oct. 13, 1953 |
| 2,788,449 | Bright | Apr. 9, 1957 |
| 2,831,113 | Weller | Apr. 15, 1958 |